United States Patent [19]
Hsieh

[11] Patent Number: 6,010,925
[45] Date of Patent: Jan. 4, 2000

[54] METHOD OF MAKING DUAL-GATE CMOSFET

[75] Inventor: Shou-Wei Hsieh, Hsinchu, Taiwan

[73] Assignee: Utek Semiconductor, Corp., Hsinchu, Taiwan

[21] Appl. No.: 09/033,521

[22] Filed: Mar. 2, 1998

[30] Foreign Application Priority Data

Feb. 3, 1998 [TW] Taiwan ................................. 87101227

[51] Int. Cl.$^7$ ................................................. H01L 21/336
[52] U.S. Cl. ........................... 438/197; 438/199; 438/299; 438/301
[58] Field of Search .................................. 438/197, 199, 438/229, 230, 231, 232, 294, 299, 301, 303, 305, 306

[56] References Cited

U.S. PATENT DOCUMENTS 5,849,616 12/1998 Ogoh ........................................ 438/231

*Primary Examiner*—John F. Niebling
*Assistant Examiner*—Christopher Lattin
*Attorney, Agent, or Firm*—Raymond Sun

[57] ABSTRACT

A method of making dual-gate structure with only three masking steps is provided. The process comprising: forming well and isolation region to define PMOS and NMOS regions on a semiconductor substrate; forming a conformal layer of PMOS gate oxide by thermal oxidation; providing a conformal layer of P type conducting material overall; removing portions of the P type material and PMOS gate oxide on the NMOS region with the aid of the first patterned mask; forming a conformal layer of NMOS gate oxide by thermal oxidation; providing a conformal layer of N type conducting material overall; forming the NMOS gate structure with the aid of the second patterned mask; performing ion implantation; providing a conformal layer of oxide overall, then etching into NMOS spacers; performing ion implantation; providing a conformal layer of protecting dielectric layer overall; proving the third patterned mask to remove portions of the protecting dielectric layer, the NMOS gate oxide, P type conducting layer and PMOS gate oxide to form the PMOS gate structure, thereby leaving a protecting dielectric layer over the NMOS region; performing ion implantation; providing a conformal layer of oxide overall, then etching into PMOS spacers; performing ion implantation.

15 Claims, 6 Drawing Sheets

METHOD OF MAKING DUAL-GATE CMOSFET

BACKGROUND OF THE INVENTION (1) Field of the Invention

The invention relates to a method of making complementary metaloxide-semiconductor field effect transistors (CMOSFET) and more particularly to a process of forming dual-gate structure by using only three masking steps.

(2) Description of the Prior Art

As semiconductor devices continually progress towards denser packing of active devices, the dissipation of the heat generated by the active devices in an integrated circuit becomes an extremely important issue. Under the consideration of power consumption and digital circuit application, the voltage operated CMOS transistors which have very high input impedance, are tolerant of large variations in supply voltage, consume almost no power in static condition and result in very good noise margins in digital circuit have become the most extensively used devices in modem Very Large Scale Integrated Circuit (VLSI) or Ultra Large Scale Integrated Circuit (ULSI). There are numerous known methods of making CMOS transistors. But most of them need at least five masking steps to have only one type of gate material formed on both of PMOSFET and NMOSFET.

FIG. 1A through 1D illustrate a typical CMOSFET fabricating process using five masking steps to form the N type poly-silicon gate on both PMOSFET and NMOSFET.

First, as shown in FIG. 1A, a N well region 200 is formed into a P type silicon wafer 100 using conventional process steps, known to one skilled in the art. Thereafter, local oxidation region (LOCOS) 300 is grown to define PMOS and NMOS region on the wafer 100. Subsequently, conformal layers of gate oxide 101 and N type poly-silicon 120 are formed overall and then patterned to form the gate structure with the aid of the first masking of photo resist 400.

Referring now to FIG. 1B, a second patterned masking of photo resist 400 is formed over the PMOS region. The photo resist 400 formed over the PMOS region acts as the protection layer of PMOS region when NMOS region is subjected to ion implantation. Subsequently, the wafer is subjected to N type ion implantation 410 to form lightly doped regions 411 of NMOS. Thereafter, the photo resist 400 is removed from the wafer to avoid the contamination of photo resist in the followed deposition process.

Referring now to FIG. 1C, a conformal layer of oxide 130 is formed overall and is then an-isotropically etched to form spacers 130 on both of the PMOS and NMOS gate structures. Subsequently, a third patterned masking of photo resist 400 is formed over the PMOS region and to act as the protection layer of PMOS region when NMOS region is subjected to ion implantation. The wafer is then subjected to N type ion implantation 420 to form heavily doped regions 421 of NMOS. Thereafter, the photo resist 400 is removed to perform the fabrication process on PMOS region.

Finally, similar masking and fabrication steps as described in FIG. 1B through FIG. 1C are repeated to form the lightly doped region 431 and heavily doped region 441 on the PMOS region, as shown in FIG. 1D. Totally, five masking steps are used in the fabrication process described above and same type of the gate material, the N type ploy-silicon, is formed on both of the NMOS and PMOS gate structures. The gate material of N type poly-silicon formed on PMOS region acts as a buried channel device that causes the punch-through effect during the operating of the Integrated Circuits. Punch-through effect caused by the buried channel device results in uncontrollable threshold voltage of the MOSFET and directly influences the operating reliability of the Integrated Circuits, thus constrains the further shrinking of channel length of CMOSFET. Much effort has been directed to avoid the formation of buried channel device and to simplify the masking steps to reduce the manufacturing cost and improve the yielding efficiency.

SUMMARY OF THE INVENTION

The present invention seeks to provide a method of making dual-gate structure on CMOSFET, not only to avoid the formation of buried channel device, but also to reduce the manufacturing cost and improve the yielding efficiency by using only three masking steps. The dual-gate structure is formed by separately forming the P type gate material on PMOSFET and N type gate materials on NMOSFET. In the process of forming separate gate structures, the thickness of the gate oxide formed on either side of PMOSFET and NMOSFET is controlled to adjust the threshold voltage in the operation of the CMOSFET. The simplification of masking steps is accomplished through the formation of non-photo-resist protecting layers on the both sides of PMOSFET and NMOSFET. The non-photo-resist protecting layer acting as a protecting mask when the wafer is subjected to ion implantation replaces some of the photo resists in the conventional masking steps, thus reduces the masking steps effectively. On the PMOS region, the protecting layer formed over the gate structure of PMOSFET also helps the formation of wider spacer regions that result in a larger lightly doped regions (LDD) on PMOSFET. A larger LDD mitigates the short channel effect and makes further shrinking of the channel length of CMOSFET possible.

According to the present invention, there is provided a method of making dual-gate structure of CMOSFET, comprising: forming well and isolation region to define the PMOS and NMOS regions on a semiconductor substrate; forming a conformal layer of PMOS gate oxide by thermal oxidation; providing a conformal layer of P type conducting material overall; using the first patterned mask to remove portions of the P type material and PMOS gate oxide on the NMOS region; forming a conformal layer of NMOS gate oxide by thermal oxidation; providing a conformal layer of N type conducting material overall; using the second patterned mask to form the NMOS gate structure; performing ion implantation; providing a conformal layer of oxide overall, then etching into NMOS spacers; performing ion implantation; providing a conformal layer of protecting dielectric layer overall; proving the third patterned mask to remove portions of the protecting dielectric layer, the NMOS gate oxide, P type conducting layer and PMOS gate oxide to form the PMOS gate structure and to leave a protecting dielectric layer over the NMOS region; performing ion implantation; providing a conformal layer of oxide overall, then etching into PMOS spacers; performing ion implantation.

Consequently, dual-gate structure on CMOSFET may be provided with only three masking steps.

BRIEF DESCRIPTION OF THE DRAWINGS

A preferred embodiment of the invention will now be described by way of example, with reference to the accompanying drawings, in which.

DESCRIPTION OF THE PREFERRED EMBODIMENT

The present invention is directed to a fabrication process of making dual-gate structure on CMOSFET having N type and P type gate material formed separately on the NMOS-FET and PMOSFET by using only three masking steps. Description of the steps, as shown in FIGS. 2–9, will now follow.

Figure 1A:
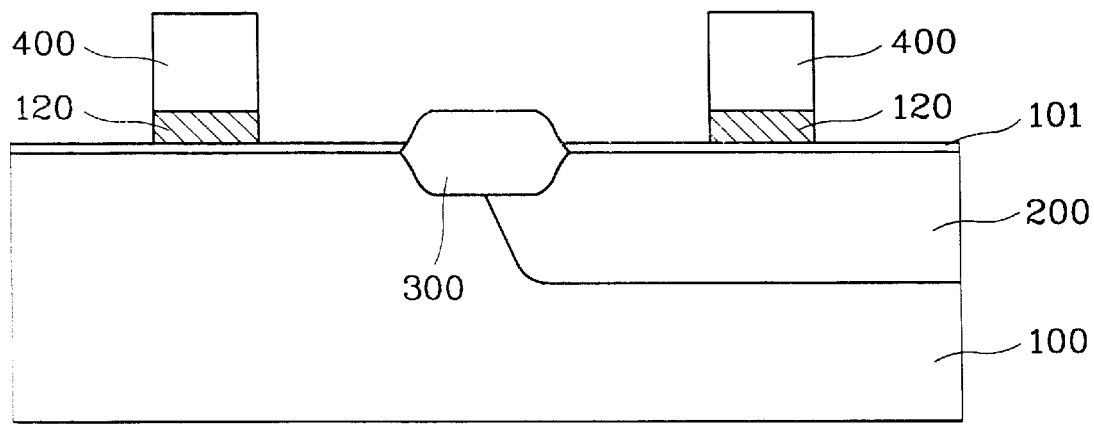
FIG. 1A through FIG. 1D show the cross sectional views illustrative of a conventional method of making CMOSFET with only one type of gate material is formed on both of the PMOS and NMOS regions.
Figure 1B:
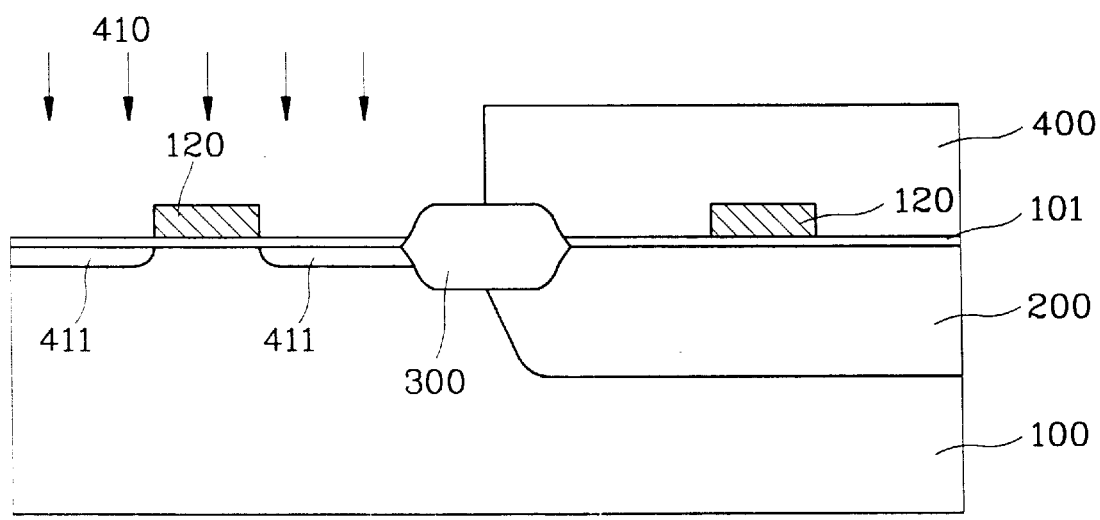
Figure 1C:
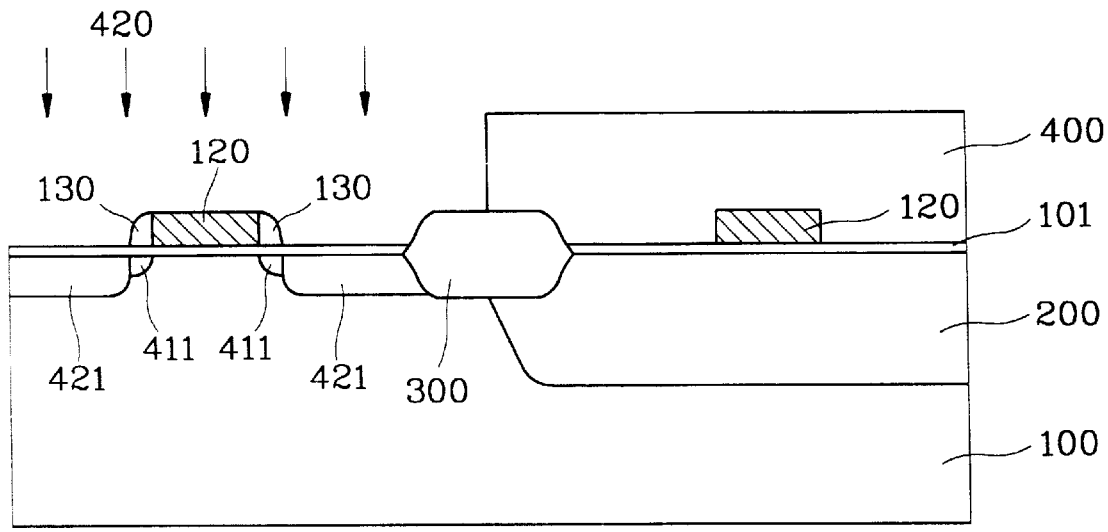
Figure 1D:
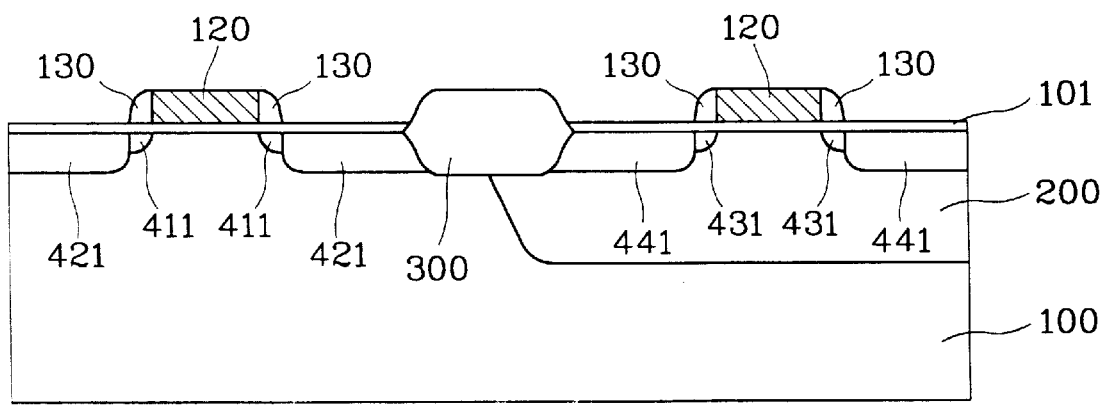
Figure 2:
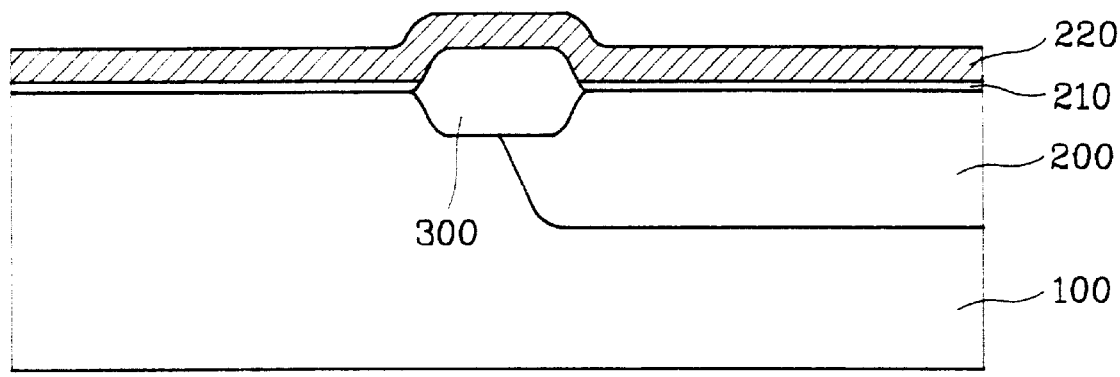
FIG. 2 shows a cross sectional view of an in-process wafer portion having a Si substrate with N well and LOCOS formed therein, thereby defining the PMOS and NMOS region, then providing conformal layers of PMOS gate oxide and P type conducting material overall.

As shown in FIG. 2, a semiconductor substrate is provided in the form of P type, <100> Si wafer 100 for the fabrication of CMOSFET. The substrate is defined into PMOS and NMOS region by using conventional process steps, known to one skilled in the art, where N well 200 and isolation region 300 have been formed into the substrate 100. The isolation region mentioned above is defined by LOCOS.

Subsequently, a thin layer of oxide 210 is grown to passivate the Si wafer and to act as the PMOS gate oxide. The PMOS gate oxide 210 is grown by thermal oxidation in the temperature range of 800° C.~1000° C. and has a thickness in the range of 50 Å~200 Å. The thickness of the gate oxide 210 is directly related to the threshold voltage of PMOS.

Then, a conformal layer of P type conduction material 220 is provided overall to act as the PMOS gate material. The P type conduction material 220 is formed by CVD.

Figure 3:
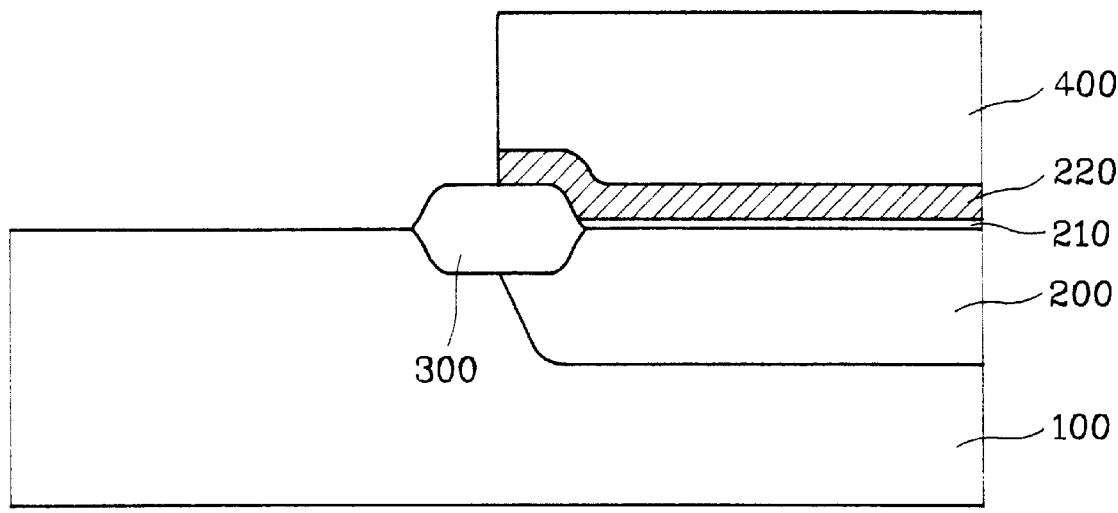
FIG. 3 shows a cross sectional view of an in-process wafer portion of FIG. 2 after removing portions of the P type conducting layer and PMOS oxide with the aid of first patterned mask.

Referring now to FIG. 3, portions of the P type conducting material 220 and PMOS gate oxide 210 are removed from the NMOS region with the aid of the first masking of photo resist 400. The P type conducting material 220 left on the PMOS region acts as a protecting layer when the substrate is subjected to ion implantation.

Figure 4:
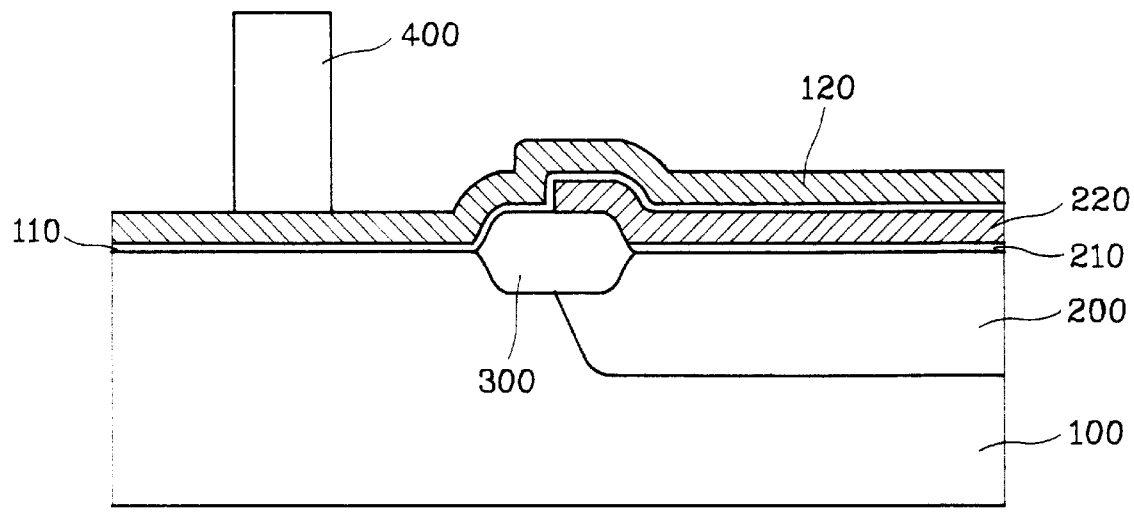
FIG. 4 shows a cross sectional view of an in-process wafer portion of FIG. 3 after providing conformal layers of NMOS gate oxide and N type conducting material overall, then forming the second patterned mask.

Referring now to FIG. 4, a thin layer of oxide 110 is grown to passivate the NMOS region and to act as the NMOS gate oxide. The NMOS gate oxide 110 is grown by thermal oxidation in the temperature range of 800° C.~1000° C. and has a thickness in the range of 50 Å~200 Å. The thickness of the gate oxide 110 is related to the threshold voltage of NMOS. The NMOS and PMOS gate oxide are thus formed separately that the NMOS and PMOS threshold voltage can be controlled separately.

Thereafter, a conformal layer of N type conduction material 120 is provided overall to act as the NMOS gate material. The N type conduction material 120 is formed by CVD. Subsequently, a second patterned masking of photo resist 400 is provided to define the position of NMOS gate.

Figure 5:
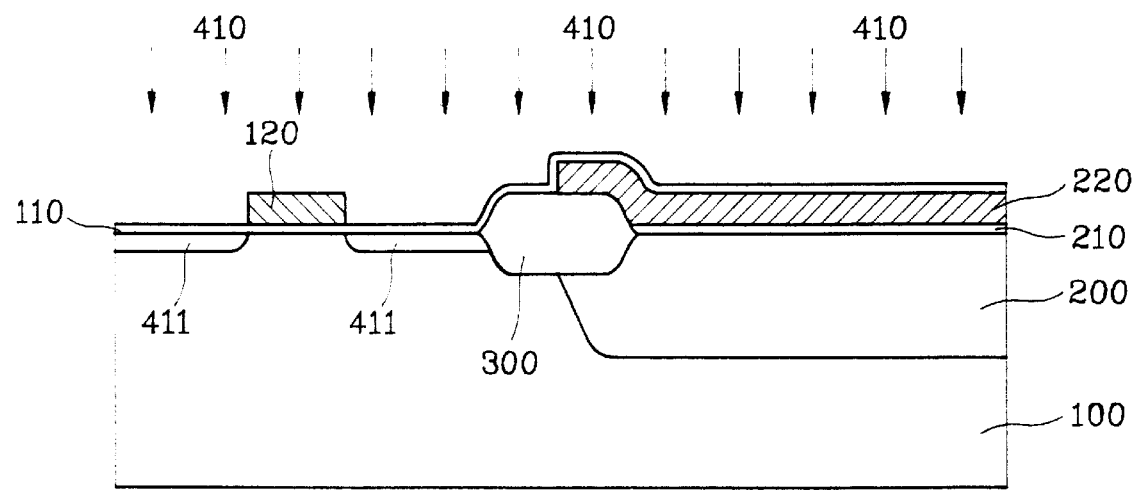
FIG. 5 shows a cross sectional view of an in-process wafer portion of FIG. 4 after forming the NMOS gate structure, then being subjected to the ion implantation.

Referring now to FIG. 5, the unmasked portions of N type conducting material 120 is removed to form the NMOS gate structure. The wafer is then subjected to ion implantation 410 to form the lightly doped regions 411. The source of the ion implantation 410 is phosphorous.

Figure 6:
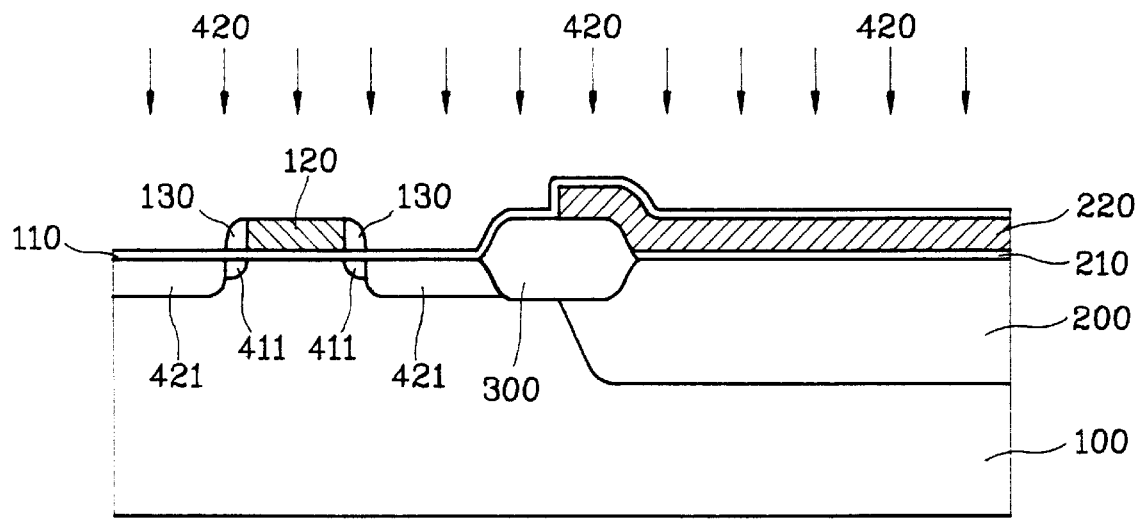
FIG. 6 shows a cross sectional view of an in-process wafer portion of FIG. 5 after forming the NMOS spacers, then being subjected to the ion implantation.

Referring now to FIG. 6, a conformal layer of oxide is provided overall and then etched an-isotropically to form the NMOS gate spacers 130. Subsequently, the wafer is subjected to ion implantation 420 to form the heavily doped regions 421. The source of the ion implantation 420 is arsine.

Figure 7:
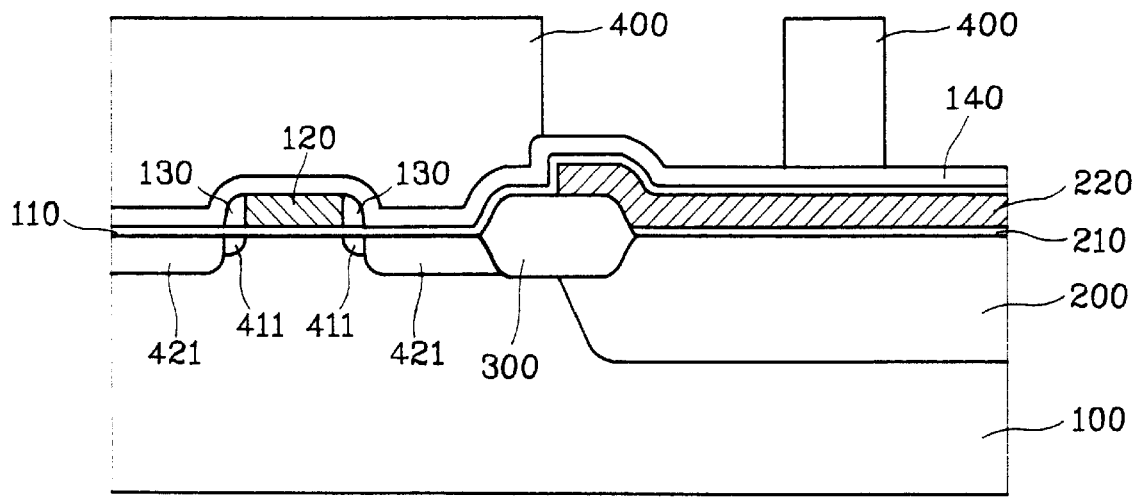
FIG. 7 shows a cross sectional view of an in-process wafer portion of FIG. 6 after providing a conformal layer of protecting dielectric material overall, then forming the second patterned mask.

Referring now to FIG. 7, a conformal layer of protecting dielectric material 140, preferably silicon nitride or oxide, is provided overall. The protecting dielectric material 140 is formed by CVD and has a thickness in the range of 1000 Å~2500 Å. The thickness of the protecting layer 140 relates to the width of the spacers formed on PMOS gate structure.

Then, a third masking of photo resist 400 is provided to define the range of protecting dielectric material 140 on NMOS region and position of PMOS gate. The protecting dielectric material 140 on the NMOS region acts as a protecting layer of NMOS region when the wafer is subjected to ion implantation of the PMOS region.

Figure 8:
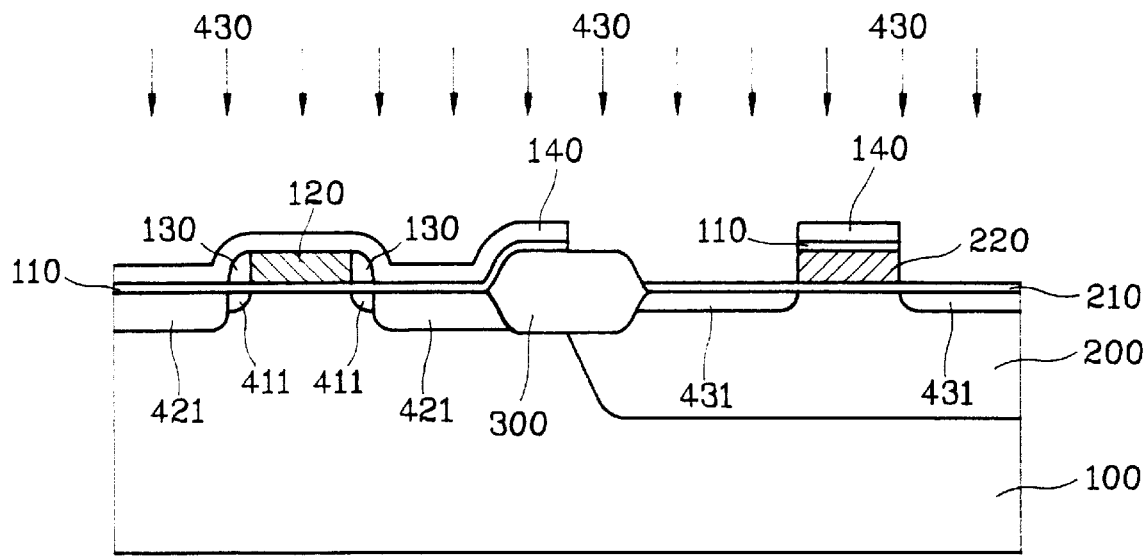
FIG. 8 shows a cross sectional view of an in-process wafer portion of FIG. 7 after removing portions of the protecting dielectric layer, NMOS gate oxide, P type conducting layer and PMOS gate oxide, then being subjected ion implantation.

Referring now to FIG. 8, the unmasked portions of protecting dielectric material 140, NMOS gate oxide 110 and P type conducting material 220 are removed to form the PMOS gate structure and leave the NMOS region covered with a protecting layer 140. The protecting dielectric layer 140 on top of the P type conducting material 220 helps the formation of a wider spacer on PMOS.

Subsequently, the wafer is subjected to ion implantation 430 to form the lightly doped regions 431. The source of the ion implantation 430 is boron.

Figure 9:
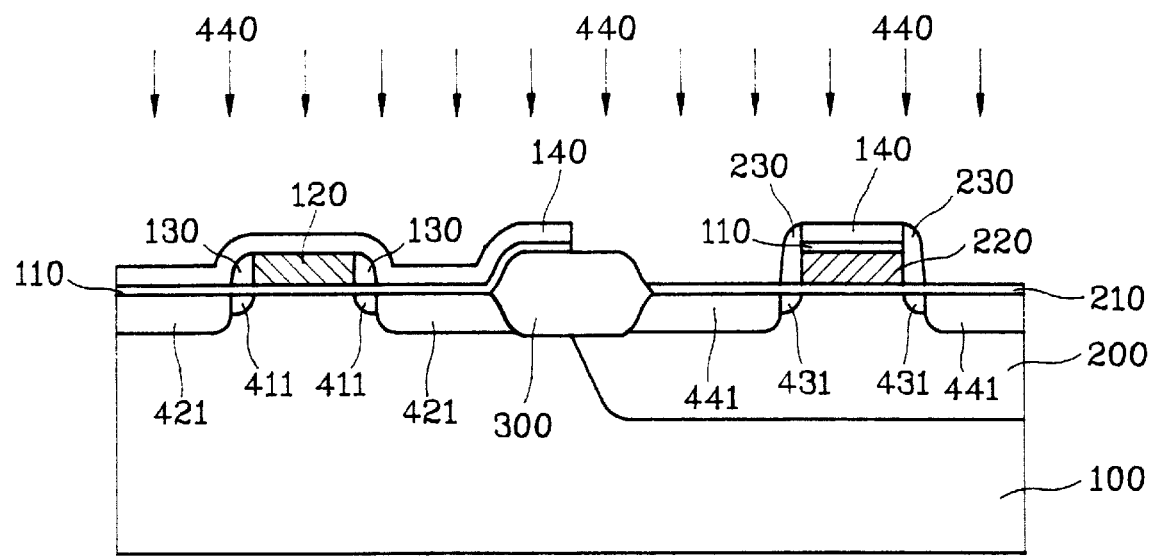
FIG. 9 shows a cross sectional view of an in-process wafer portion of FIG. 8 after forming the PMOS spacers, then being subjected to the ion implantation.

Referring now to FIG. 9, a conformal layer of oxide is provided overall and then etched an-isotropically to form the PMOS gate spacers 230. Finally, the wafer is subjected to ion implantation 440 to form the heavily doped regions 441 and completes the process of making dual-gate CMOSFET. The source of the ion implantation 440 is boron.

It is also contemplated that similar process steps can be used to make dual-gate CMOSFET, such as a N type semiconductor substrate is provided or sequences in completing the PMOS and NMOS structures are changed. In such case, the layer formation, masking and ion implantation sequences are therefore changed.

Although the present invention has been described with reference to a preferred embodiment, it should be appreciated that various modifications and adaptations can be made without departing from the scope of the invention as defined in the claims.

I claim:

1. A process for making dual-gate CMOSFET on a starting semiconductor substrate, said process comprising:

a) forming well and isolation region into said semiconductor substrate, therefore said semiconductor substrate being defined into PMOS and NMOS region;

b) forming a thin layer of thermal oxide on the surface of said semiconductor substrate, said thermal oxide layer acting as the PMOS gate oxide;

c) forming an overall conformal layer of P type conducting material, the layer of said P type conducting material in the said PMOS region acting as a protecting layer and the gate material of said PMOS;

d) removing portions of said P type conducting material and said PMOS gate oxide from said NMOS region with the aid of the first patterned mask, thereby exposing said NMOS region and leaving said PMOS region covered with said P type conducting material;

e) forming a thin layer of thermal oxide on the surface of said semiconductor substrate, said thermal oxide layer acting as the NMOS gate oxide on the region of NMOS and the stop layer for the etching process of NMOS gate structure;

f) forming an overall conformal layer of N type conducting material, then selectively removing portions of said N type conducting material and said NMOS gate oxide to form the NMOS gate structure, thereby exposing portions of said semiconductor substrate with the aid of second patterned mask;

g) ion implanting said exposed semiconductor substrate to form lightly doped regions of NMOS;

h) forming a conformal layer of oxide, wherein said oxide layer is then an-isotropically etched to form NMOS gate spacers;

i) ion implanting said exposed semiconductor substrate to form heavily doped regions of NMOS;

j) forming a conformal layer of protecting dielectric material;

k) selectively removing portions of said protecting dielectric material, said NMOS gate oxide and said P type conducting material to form the PMOS gate structure and leave the NMOS region covered with the protecting dielectric layer with the aid of the third patterned mask, thereby exposing portions of PMOS region;

l) ion implanting said exposed portions of PMOS region to form lightly doped regions of PMOS;

m) forming a conformal layer of oxide, wherein said oxide layer is then an-isotropically etched to form PMOS gate spacers;

n) ion implanting said exposed portions of PMOS region to form heavily doped regions of PMOS.

2. The process as recited in claim 1, wherein said semiconductor substrate and well region is P type semiconductor substrate and N well region.

3. The process as recited in claim 2, wherein said P type semiconductor substrate is P type Si substrate.

4. The process as recited in claim 1, wherein said semiconductor substrate and well region is N type semiconductor substrate and P well region.

5. The process as recited in claim 4, wherein said N type semiconductor substrate is N type Si substrate.

6. The process as recited in claim 1, wherein said isolation region is LOCOS isolation.

7. The process as recited in claim 1, wherein said isolation region is trench isolation.

8. The process as recited in claim 1, wherein said PMOS gate oxide has a thickness in the range of 50 Å~200 Å.

9. The process as recited in claim 1, wherein said PMOS gate oxide is formed in the temperature range of 800° C.~1000° C.

10. The process as recited in claim 1, wherein said NMOS gate oxide has a thickness in the range of 50 Å~200 Å.

11. The process as recited in claim 1, wherein said NMOS gate oxide is formed in the temperature range of 800° C.~1000° C.

12. The process as recited in claim 1, wherein said protecting dielectric material is silicon nitride.

13. The process as recited in claim 1, wherein said protecting dielectric material is oxide.

14. The process as recited in claim 13, wherein said oxide is silicon dioxide.

15. The process as recited in claim 1, wherein said protecting dielectric material has a thickness in the range of 1000 Å~2500 Å.

* * * * *